United States Patent
Bartl et al.

(10) Patent No.: US 10,715,930 B2
(45) Date of Patent: *Jul. 14, 2020

(54) SYSTEM AND METHOD FOR AN OPTICAL MEMS TRANSDUCER

(71) Applicant: Infineon Technologies AG, Neubiberg (DE)

(72) Inventors: Ulf Bartl, Villach (AT); Alfons Dehe, Villingen-Schwenning (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 219 days.

This patent is subject to a terminal disclaimer.

(21) Appl. No.: 15/961,416

(22) Filed: Apr. 24, 2018

(65) Prior Publication Data

US 2018/0249258 A1    Aug. 30, 2018

Related U.S. Application Data

(63) Continuation of application No. 15/090,947, filed on Apr. 5, 2016, now Pat. No. 9,973,860.

(51) Int. Cl.
*H04R 23/00* (2006.01)
*B81B 3/00* (2006.01)
(Continued)

(52) U.S. Cl.
CPC ......... *H04R 23/008* (2013.01); *B81B 3/0083* (2013.01); *B81C 1/00158* (2013.01);
(Continued)

(58) Field of Classification Search
CPC .......... B81B 3/0083; B81B 2201/0264; B81B 2201/047; B81C 1/00158; G02B 5/1814; G02B 27/4233; G02B 27/42; H04R 31/003; H04R 7/18; H04R 23/00; H04R 2201/003; H04R 2207/021; H04R 2307/207
(Continued)

(56) References Cited

U.S. PATENT DOCUMENTS 3,641,354 A   2/1972 DeMent
4,637,684 A   1/1987 Tomita et al.
(Continued)

OTHER PUBLICATIONS

Kuntzman et al., "Performance and Modeling of a Fully Packaged Micromachined Optical Microphone", Journal of Micorelectromechanical Systems, vol. 20, No. 4, Aug. 2011, pp. 828-833.

*Primary Examiner* — William R Alexander
(74) *Attorney, Agent, or Firm* — Slater Matsil, LLP

(57) ABSTRACT

According to an embodiment, an optical MEMS transducer includes a diffraction structure including alternating first reflective elements and openings arranged in a first plane, a reflection structure including second reflective elements and configured to deflect with respect to the diffraction structure, and an optical element configured to direct a first optical signal at the diffraction structure and the reflection structure and to receive a second optical signal from the diffraction structure and the reflection structure. The second reflective elements are arranged in the first plane when the reflection structure is at rest. Other embodiments include corresponding systems and apparatus, each configured to perform various embodiment methods.

20 Claims, 7 Drawing Sheets

(51) Int. Cl.
*B81C 1/00* (2006.01)
*G02B 5/18* (2006.01)
*G02B 27/42* (2006.01)
*H04R 31/00* (2006.01)
*H04R 7/18* (2006.01)

(52) U.S. Cl.
CPC ....... *G02B 5/1814* (2013.01); *G02B 27/4233* (2013.01); *H04R 31/003* (2013.01); *B81B 2201/0264* (2013.01); *B81B 2201/047* (2013.01); *H04R 7/18* (2013.01); *H04R 23/00* (2013.01); *H04R 2201/003* (2013.01); *H04R 2207/021* (2013.01); *H04R 2307/207* (2013.01)

(58) Field of Classification Search
USPC ...................................................... 359/223.1
See application file for complete search history.

(56) References Cited

U.S. PATENT DOCUMENTS

| | | | |
|---|---|---|---|
| 6,341,526 B1 | 1/2002 | Castracane et al. | |
| 8,405,899 B2 | 3/2013 | Chui | |
| 9,024,396 B2 | 5/2015 | Dehe | |
| 9,503,820 B2 | 11/2016 | Hall et al. | |
| 2002/0039463 A1 | 4/2002 | Degertekin et al. | |
| 2002/0054424 A1 | 5/2002 | Miles | |
| 2003/0129404 A1 | 7/2003 | Argoitia et al. | |
| 2004/0130728 A1 | 7/2004 | Degertekin et al. | |
| 2006/0017689 A1 | 1/2006 | Faase et al. | |
| 2006/0181712 A1 | 8/2006 | Degertekin et al. | |
| 2006/0192976 A1 | 8/2006 | Hall et al. | |
| 2006/0227845 A1 | 10/2006 | Degertekin et al. | |
| 2007/0103697 A1 | 5/2007 | Degertekin | |
| 2007/0165896 A1 | 7/2007 | Miles et al. | |
| 2011/0203378 A1 | 8/2011 | Buccafusca et al. | |
| 2014/0054894 A1 | 2/2014 | Olesen | |
| 2014/0161290 A1* | 6/2014 | Jenkins | H04R 1/222 381/174 |
| 2015/0175404 A1* | 6/2015 | Jenkins | B81B 3/0075 257/415 |
| 2015/0323456 A1 | 11/2015 | Agashe et al. | |
| 2016/0007108 A1 | 1/2016 | Lee et al. | |
| 2016/0007125 A1 | 1/2016 | Lee et al. | |
| 2016/0219378 A1 | 7/2016 | Hall et al. | |
| 2016/0221822 A1 | 8/2016 | Krumbein et al. | |
| 2018/0044167 A1* | 2/2018 | Jenkins | B81B 3/0072 |
| 2018/0091906 A1* | 3/2018 | Khenkin | H04R 31/003 |
| 2018/0152792 A1* | 5/2018 | Hoekstra | H04R 19/005 |
| 2019/0047847 A1* | 2/2019 | Khenkin | B81B 7/02 |
| 2019/0047848 A1* | 2/2019 | Hoekstra | H04R 19/04 |

* cited by examiner

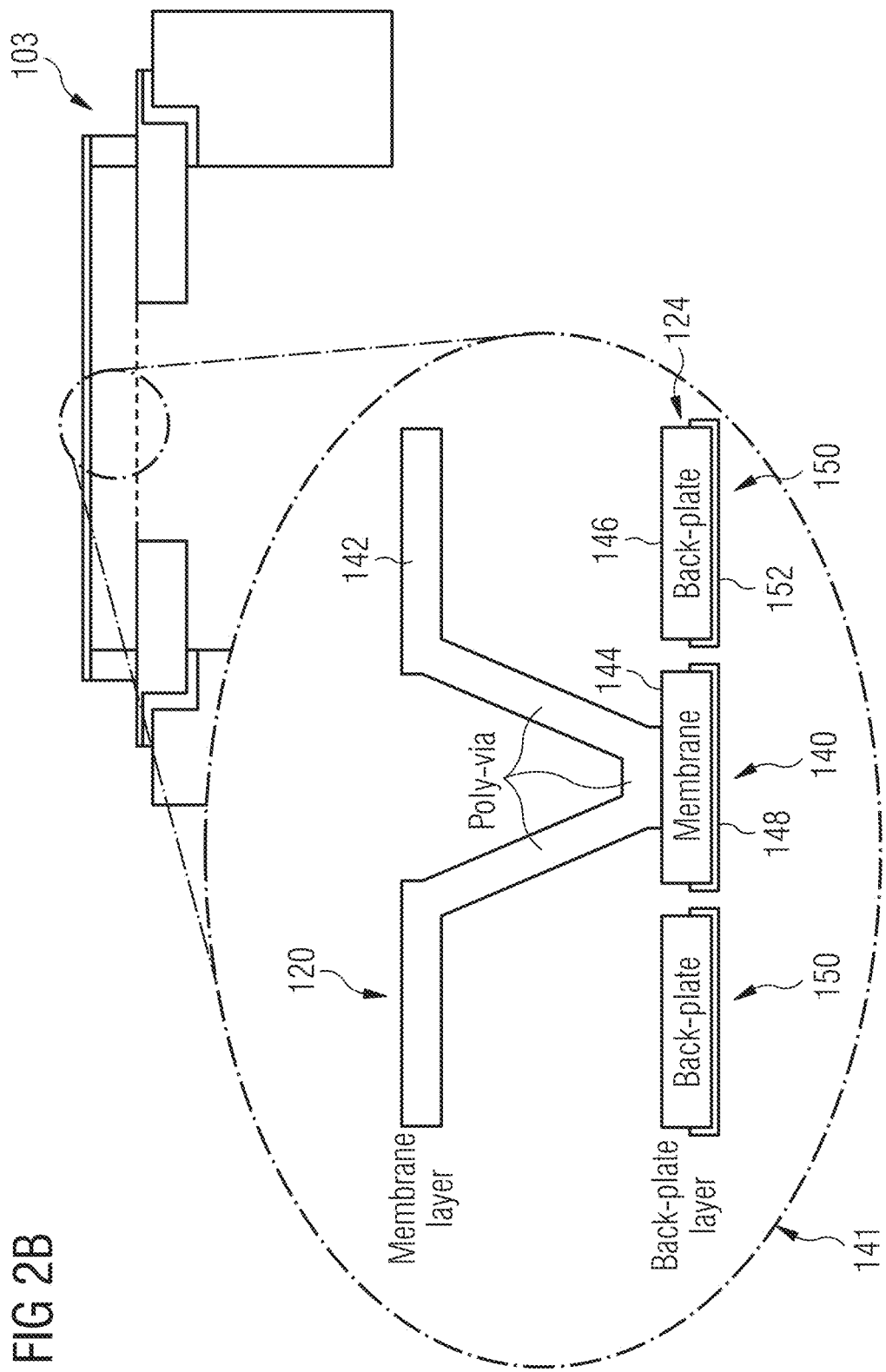

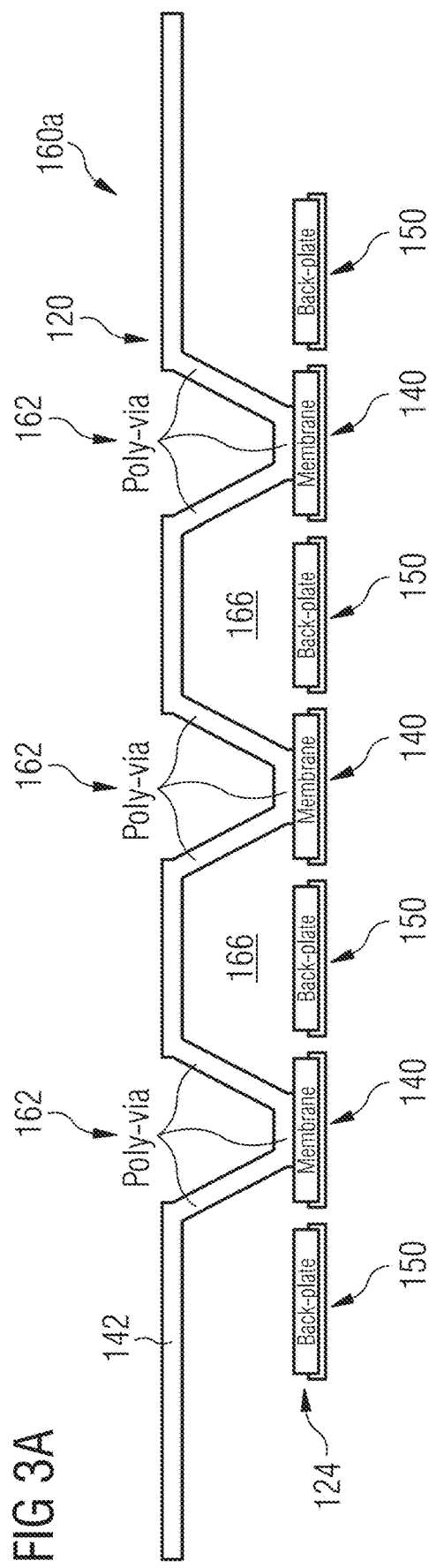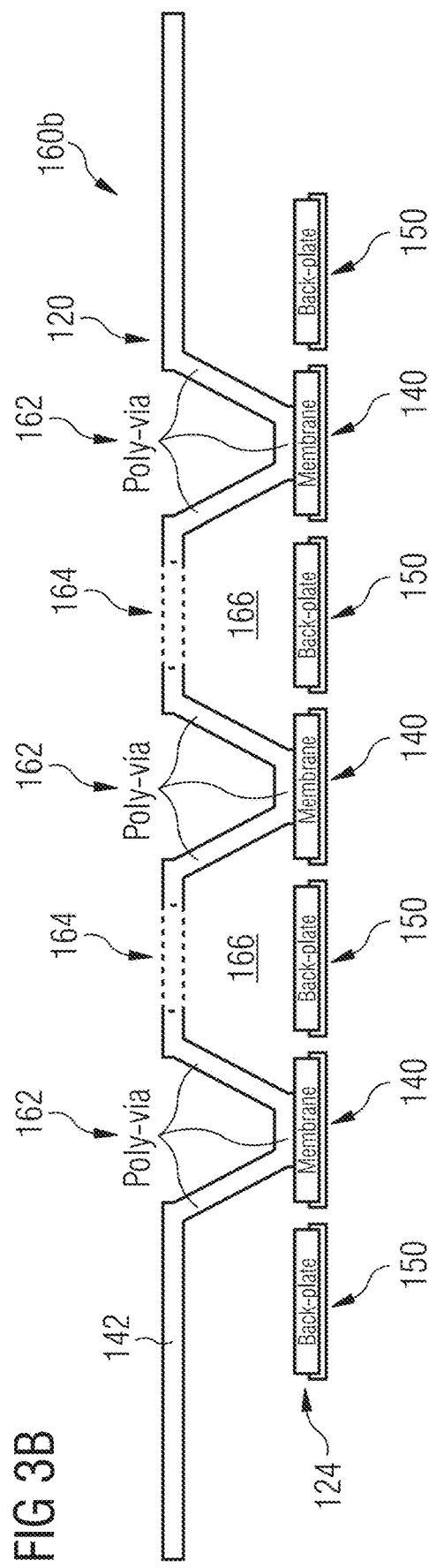

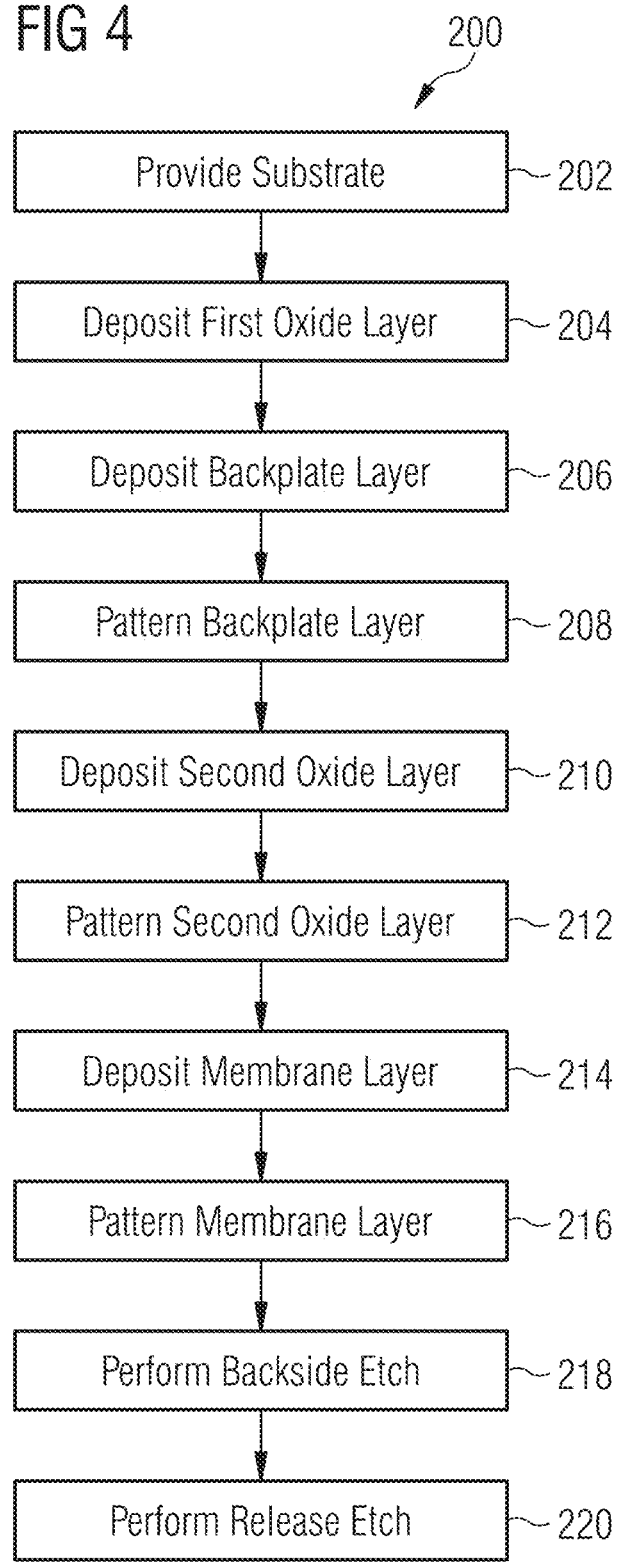

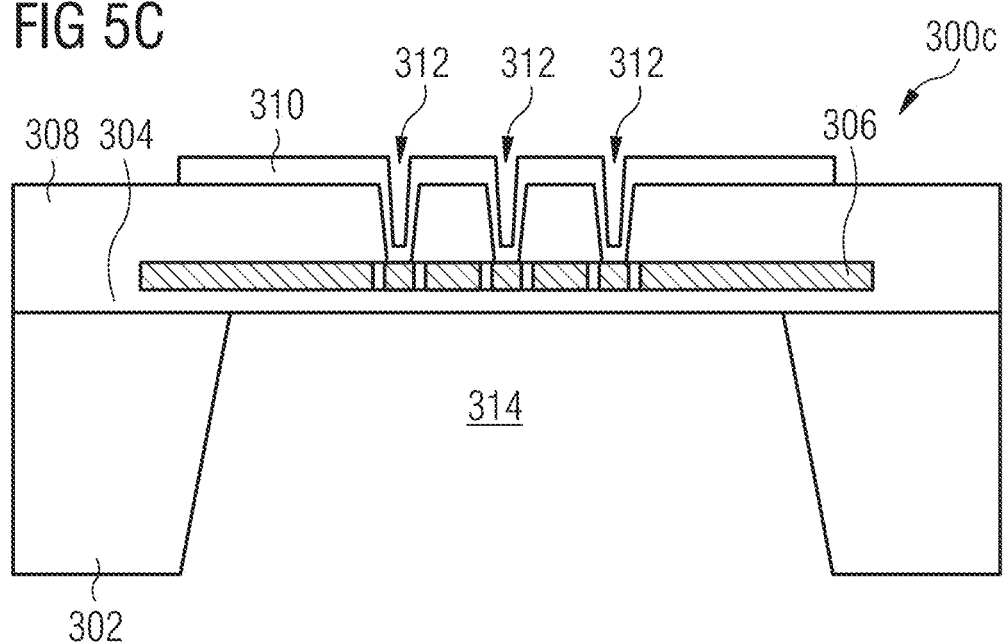
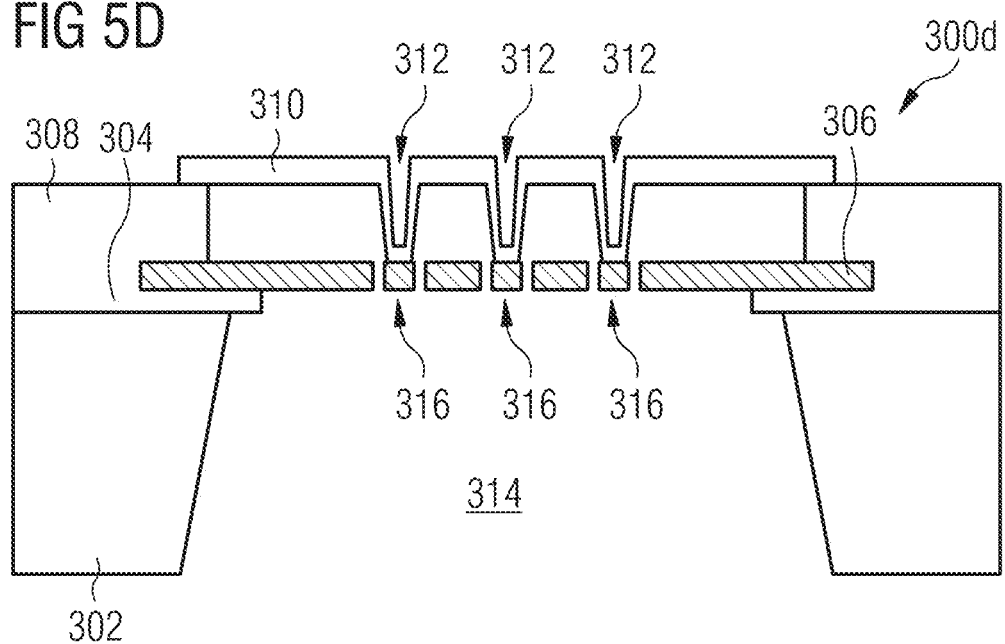

SYSTEM AND METHOD FOR AN OPTICAL MEMS TRANSDUCER

This application is a continuation of U.S. patent application Ser. No. 15/090,947, filed Apr. 5, 2016, which application is hereby incorporated herein by reference in its entirety.

TECHNICAL FIELD

The present invention relates generally to microfabricated devices, and, in particular embodiments, to a system and method for an optical microelectromechanical systems (MEMS) transducer.

BACKGROUND

Transducers convert signals from one domain to another and are often used in sensors. One common transducer operating as a sensor that is seen in everyday life is a microphone, which converts, i.e., transduces, sound waves into electrical signals. Another example of a common sensor is a thermometer. Various transducers exist that serve as thermometers by transducing temperature signals into electrical signals.

Microelectromechanical system (MEMS) based transducers include a family of sensors and actuators produced using micromachining techniques. MEMS sensors, such as a MEMS microphone, gather information from the environment by measuring the change of physical state in the transducer and transferring a transduced signal to processing electronics that are connected to the MEMS sensor. MEMS devices may be manufactured using micromachining fabrication techniques similar to those used for integrated circuits.

MEMS devices may be designed to function as, for example, oscillators, resonators, accelerometers, gyroscopes, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits. Other MEMS devices use optical sensing techniques for transducing the physical phenomenon into electrical signals. In such applications, an optical signal varies based on the physical phenomenon, and the optical signal is converted into a voltage signal using a photodiode and interface circuits, for example. One such optical sensing device is an optical MEMS microphone.

SUMMARY

According to an embodiment, an optical MEMS transducer includes a diffraction structure including alternating first reflective elements and openings arranged in a first plane, a reflection structure including second reflective elements and configured to deflect with respect to the diffraction structure, and an optical element configured to direct a first optical signal at the diffraction structure and the reflection structure and to receive a second optical signal from the diffraction structure and the reflection structure. The second reflective elements are arranged in the first plane when the reflection structure is at rest. Other embodiments include corresponding systems and apparatus, each configured to perform various embodiment methods.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrate cross-sectional side views of an embodiment optical MEMS microphone;

FIGS. 3A and 3B illustrate cross-sectional side views of further embodiment elements for an embodiment optical MEMS microphone;

FIG. 4 illustrates a flowchart diagram of an embodiment method of fabrication for an embodiment optical MEMS microphone;

FIGS. 5A, 5B, 5C, and 5D illustrate cross-sectional perspective views of steps in an embodiment method of fabrication.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include MEMS transducer systems, MEMS microphone systems, optical MEMS microphone systems, and fabrication methods of optical MEMS microphones. In other embodiments, aspects may also be applied to other applications involving any type of sensor or transducer according to any fashion as known in the art.

In various embodiments, an optical MEMS microphone includes a laser directed at a diffraction grating and membrane. The laser is reflected from the diffraction grating and the membrane as a reflected optical signal that is measured by a photodetector. As the membrane deflects due to pressure signals, such as, e.g., sound waves, the distance between the diffraction grating and the membrane varies, which in turn causes the reflected optical signal to vary. When the reflective surface of the membrane and the diffraction grating are in different planes, it may be possible for multiple reflections to occur between the membrane and the backplate. Such multiple reflections may affect the resulting measured optical signal in a way that is not consistent with the deflection of the membrane. Thus, according to various embodiments described herein, an optical MEMS microphone includes a membrane with a reflective surface or surfaces and a diffraction grating, where the reflective surface or surfaces are formed in the same plane as the diffraction grating. For example, the diffraction grating may include multiple grating elements separated by slots to form the diffraction grating, and the membrane may include reflective elements arranged in the slots between grating elements of the diffraction grating such that the diffraction grating and the reflective elements of the membrane are arranged in the same plane when the membrane is undeflected.

Figure 1:
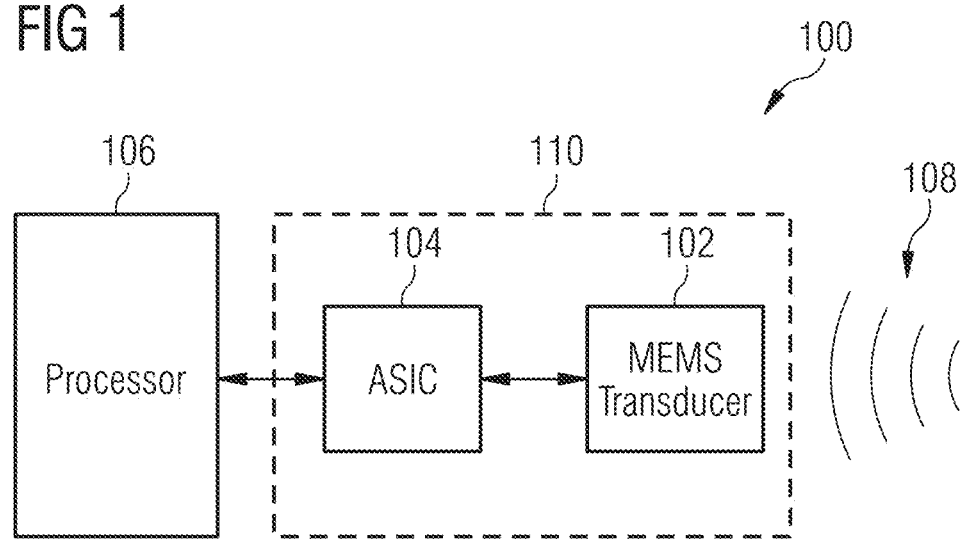
FIG. 1 illustrates a system block diagram of an embodiment MEMS transducer system.

FIG. 1 illustrates a system block diagram of an embodiment MEMS transducer system 100 including MEMS transducer 102, application specific integrated circuit (ASIC) 104, and processor 106. According to various embodiments, MEMS transducer 102 receives physical signal 108, generates a transduced signal, and provides the transduced signal to ASIC 104. In specific embodiments, physical signal 108 is a pressure signal, such as an acoustic pressure wave, and MEMS transducer 102 is a MEMS microphone, such as an optical MEMS microphone. In such embodiments, MEMS transducer 102, as an optical MEMS microphone, converts physical signal 108, e.g., a pressure signal, into an analog electrical signal that is supplied to ASIC 104. Embodiment MEMS transducers and MEMS fabrication sequences are described hereinafter.

In various embodiments, based on the analog electrical signal from MEMS transducer 102, ASIC 104 generates an output signal and provides it to processor 106. ASIC 104 may perform various functions. In some embodiments, ASIC 104 provides a drive signal to MEMS transducer 102 in order to generate an optical signal and also receives an optical measurement signal. In further embodiments, ASIC 104 may include a buffer circuit or an amplifier circuit. In some embodiments, ASIC 104 may include additional elements such as an analog-to-digital converter (ADC). In such embodiments, ASIC 104 provides a digital signal that corresponds to physical signal 108 to processor 106. Further, ASIC 104 may also include an I/O interface circuit for communicating through a communication interface to processor 106.

According to various embodiments, transducer unit no includes ASIC 104 and MEMS transducer 102. In such embodiments, transducer unit 110 may be a packaged device, such as a packaged microphone, including a package opening, such as a sound port, for receiving physical signal 108. Transducer unit no may include a shared circuit board with separate semiconductor dies for ASIC 104 and MEMS transducer 102 attached to the shared circuit board. In other embodiments, ASIC 104 and MEMS transducer 102 are assembled in a chip stack as a system-on-chip (SoC), such as through flip-chip bonding. In still other embodiments, ASIC 104 and MEMS transducer 102 are integrated on a single semiconductor die, i.e., monolithically integrated, as a SoC.

In various embodiments, processor 106 receives an analog or digital electrical signal from ASIC 104. Processor 106 may be a dedicated audio processor, such as an audio coder/decoder (CODEC). In other embodiments, processor 106 may be a general purpose processor. In such various embodiments, processor 106 may be a microprocessor, a digital signal processor (DSP), or a field programmable gate array (FPGA). In alternative embodiments, processor 106 is formed of discrete logic components.

According to various embodiments, ASIC 104 may provide a single signal, such as a single-ended signal, or a differential single to processor 106 that is representative of physical signal 108. In other embodiments, ASIC 104 may provide signals to processor 106 using various communication protocols including data or clock lines. Further, in various embodiments, MEMS transducer 102 may provide a single signal, such as a single-ended signal, or a differential signal to ASIC 104 that is representative of physical signal 108.

Figure 2A:
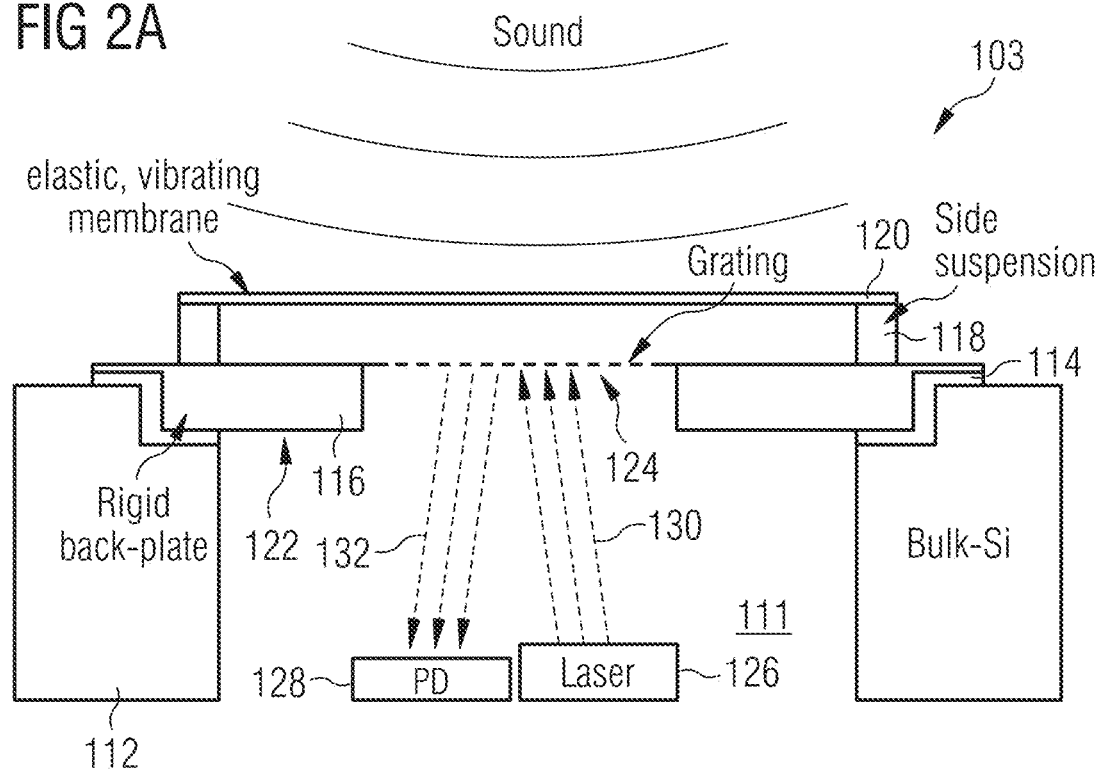

FIGS. 2A and 2B illustrate cross-sectional side views of an embodiment optical MEMS microphone 103, which is one implementation of MEMS transducer 102. Specifically, FIG. 2A illustrates an operating principle and FIG. 2B illustrates an expanded view of embodiment structures. According to various embodiments, optical MEMS microphone 103 includes substrate 112, backplate 116, membrane 120, laser 126, and photodiode 128. In various embodiments, laser 126 emits incident optical signal 130 directed at diffraction grating 124 in backplate 116. Membrane 120 includes reflective elements 140 formed in the same plane as diffraction grating 124. Reflective elements 140 are omitted from FIG. 2A for ease of illustration, but are shown in expanded view 141 in FIG. 2B. Thus, incident optical signal 130 is reflected by diffraction grating 124 and reflective elements 140 of membrane 120 to form reflected optical signal 132, which is received and measured by photodiode 128. In such embodiments, pressure signals, such as sound waves as shown, cause membrane 120 to deflect, which produces a variation in reflected optical signal 132 that is based on the pressure signals received at membrane 120. Further discussion of the reflection surface is discussed hereinafter, such as in reference to expanded view 141.

According to various embodiments, substrate 112 may be formed from a wafer. Substrate 112 may be a semiconductor substrate, such as silicon for example. In various embodiments, cavity 111 is formed within substrate 112. Insulating layer 114 is formed on a top surface of substrate 112 and backplate 116 is formed on a top surface of insulating layer 114. In such embodiments, insulating layer 114 may be an electrically insulating material, such as silicon oxide, for example. Backplate 116 may be a rigid backplate. In various embodiments, backplate 116 includes structural support 122 and diffraction grating 124. Structural support may be thick patterned beams or a thick layer of supporting material while diffraction grating 124 may be a smaller structure with multiple slots or slits formed in parallel as a diffraction grating. In some embodiments, diffraction grating 124 is thinner than structural support 122. In other embodiments, diffraction grating 124 has a same layer thickness as structural support 122. In various embodiments, backplate 116 may be formed of a conductive or non-conductive material. For example, backplate 116 is formed of polysilicon in some embodiments.

According to various embodiments, spacing structure 118 is formed on top of backplate 116 and supports membrane 120. Spacing structure 118 may be an electrically insulating material, such as silicon oxide, for example. In some embodiments, spacing structure 118 is formed of a same material as insulating layer 114. Membrane 120 may be formed of a conductive or non-conductive material. For example, membrane 120 is formed of polysilicon in some embodiments. In some embodiments, membrane 120 is formed of a same material as backplate 116.

According to various embodiments, laser 126 is a light emitting diode (LED) laser. In further embodiments, laser 126 includes multiple LED lasers arranged in parallel. In various embodiments, photodiode 128 may include multiple photodiode structures arranged together. In alternative embodiments laser 126 may include any type of optical signal generator, such as any source of coherent light, and photodiode 128 may include any type of optical signal detector. In such various embodiments, laser 126 may be any type of laser, or, alternatively, laser 126 may be replaced by any type of LED. Photodiode 128 may be implemented using any type of photodetector. In some embodiments, photodiode 128 is implemented using one or more charged coupled devices (CCDs).

According to various embodiments, reflective elements 140 are formed in the same plane as diffraction grating 124, as shown in expanded view 141 in FIG. 2B. Expanded view 141 depicts membrane 120 and diffraction grating 124 in detail. In various embodiments, membrane 120 includes membrane layer 142 and reflective elements 140, which include support layer 144 and reflective coating 148. Diffraction grating 124, as part of backplate 116, includes grating structures 150, which include backplate layer 146 and reflective coating 152.

According to various embodiments, membrane layer 142 extends down to support layer 144. In such embodiments, membrane layer 142 may be formed with vias extending down to support layer 144 in order to connect reflective elements 140 to membrane layer 142. In other embodiments, another connection structure may be formed between support layer 144 and membrane layer 142. In some embodiments, reflective coating 148 and reflective coating 152 are separate material coatings or material layers applied to support layer 144 and backplate layer 146, respectively. Alternatively, reflective coating 148 and reflective coating 152 are surfaces of support layer 144 and backplate layer 146, respectively, and are formed of a same material.

In various embodiments, reflective coating 148 and reflective coating 152 are implemented using one or more metals. For example, in some embodiments, reflective coating 148 and reflective coating 152 include gold, aluminum, silver, or titanium, such as titanium nitride. In alternative embodiments, reflective coating 148 and reflective coating 152 are implemented using dielectric materials as a dielectric mirror. In such embodiments, reflective coating 148 and reflective coating 152 may be implemented as a dielectric stack including alternating high and low refractive index materials. Further, the layers selected for the dielectric stack may be selected based on the wavelength of the light emitted from laser 126.

According to various embodiments, reflective elements 140 is connected to membrane layer 142 in order to deflect with deflections of membrane 120. As shown, reflective elements 140 are formed in the same plane extending horizontally as grating structures 150 and are arranged in that same plane when membrane 120 is at rest. Grating structures 150 may be long parallel beams with slots between each of the long parallel beams in which reflective elements 140 are arranged.

According to various embodiments, as membrane 120, and correspondingly reflective elements 140, deflects, diffraction grating 124 with grating structure 150 is stationary. For example, structural support 122 is a rigid structure with large openings for reducing the resistance to fluidic transport and supporting diffraction grating 124. In such embodiments, structural support 122 includes multiple thick support beams or a perforated rigid plate. As membrane 120 deflects, reflective coating 148 and reflective coating 152, which form reflective surfaces for incident optical signal 130, are offset from each other. The offset between reflective coating 148 and reflective coating 152 produces a phase shift difference in the reflected beams that results in a variation in the intensity of the combined reflected beams as reflected optical signal 132. In such embodiments, deflections of membrane 120, which are based on incident pressure signals, produce corresponding variations in reflected optical signal 132 as reflective elements 140 deflect with membrane 120.

In applications where a reflective surface of the membrane is not in the same plane as the reflective surface of the backplate when the membrane is at rest, incident optical signals may be reflected and combined as described hereinabove. In such applications, however, there is a higher probability that some reflected optical signals will reflect a second time off the backside of the backplate. Thus, embodiments described herein include reflective elements attached to a deflectable membrane, such as reflective elements 140 attached to membrane 120, and formed in a same plane as a reflective surface of the backplate, such as reflective coating 152 on grating structure 150. Various further details in relation to embodiment structures, materials, and fabrication methods for embodiment MEMS transducers, such as optical MEMS microphone 103, are described hereinafter in reference to the other figures.

FIGS. 3A and 3B illustrate cross-sectional side views of further embodiment elements for an embodiment optical MEMS microphone. Specifically, FIG. 3A illustrates portion 160a including part of membrane 120 and part of diffraction grating 124, and FIG. 3B illustrates portion 160b including part of membrane 120 with added ventilation openings 164 and part of diffraction grating 124. Portion 160a and portion 160b may be part of MEMS transducer 102 or optical MEMS microphone 103, as described hereinabove in reference to FIGS. 1, 2A, and 2B. According to various embodiments, membrane 120 includes connecting vias 162 that connect membrane 120 to reflective elements 140. For example, membrane 120 is a conductive material such as polysilicon in some embodiments. In such embodiments, connecting vias 162 are polysilicon vias extending from membrane layer 142 to reflective elements 140.

In various embodiments, any number of reflective elements 140 may be included. For example, reflective elements 140 may be included for each slot between grating structures 150. In some embodiments, up to 100 slots and 100 reflective elements 140 are included. In other embodiments, up to 50 slots and 50 reflective elements 140 are included. In particular embodiments, up to 20 slots and 20 reflective elements 140 are included. In such various embodiments, connecting vias 162 are included in number matching the number of reflective elements 140.

In alternative embodiments, connecting vias 162 may be replaced by other structures (not shown). For example, membrane layer 142 may be formed in trenches extending down to the area between grating structures 150. In another embodiment, a separate material from membrane layer 142 may be formed from reflective elements 140 to membrane layer 142.

According to various embodiments, membrane 120 may also include ventilation openings 164 between connecting vias 162, as shown by portion 160b in FIG. 3B. As membrane 120 deflects, enclosed volume 166 above grating structures 150, below membrane layer 142, and enclosed by connecting vias 162 may increase or decrease. As enclosed volume 166 increases or decreases, damping of the motion of membrane 120 may occur. In various embodiments, ventilation openings 164 in membrane 120 provide fluidic transport into and out of enclosed volume 166, as shown by portion 160b in FIG. 3B. In such embodiments, damping of the motion of membrane 120 may be reduced by ventilation openings 164.

FIG. 4 illustrates a flowchart diagram of an embodiment method of fabrication 200 for an embodiment optical MEMS microphone, such as described hereinabove in reference to MEMS transducer 102 or optical MEMS microphone 103 in FIGS. 1, 2A, and 2B. FIGS. 5A, 5B, 5C, and 5D illustrate cross-sectional perspective views of steps in method of fabrication 200. According to various embodiments, method of fabrication 200 includes steps 202-220. In such various embodiments, step 202 includes providing substrate 302, as illustrated by intermediate structure 300a in FIG. 5A, which illustrates the intermediate structure after completing step 208.

In various embodiments, substrate 302 is a semiconductor substrate. Substrate 302 may be doped for improved conductivity in some embodiments. In particular embodiments, substrate 302 is silicon. Particularly, substrate 302 may be monocrystalline silicon. In alternative an embodiment, substrate 302 is germanium. In still another alternative embodiment, substrate 302 is carbon. In further alternative embodiments, substrate 302 is a compound semiconductor such as gallium arsenide, silicon carbide, silicon germanium, indium phosphide, or gallium nitride. In still further alternative embodiments, substrate 302 may be other semiconductive or conductive substrate materials as are known to those of skill in the art. In particular alternative embodiments, the substrate may include organic materials such as glass or ceramic. Substrate 302 may be a wafer.

Figure 5A:
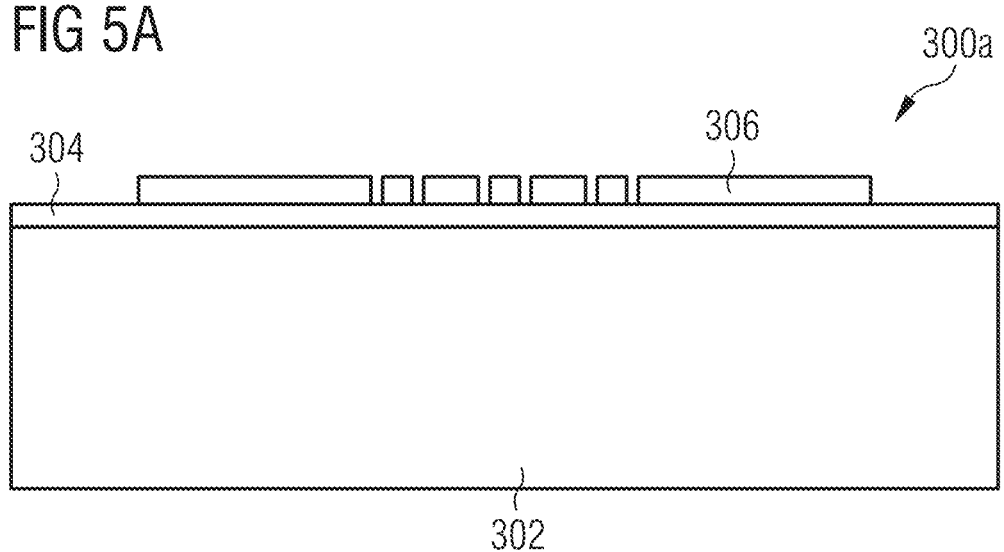

Following step 202, step 204 includes depositing first oxide layer 304. Intermediate structure 300a of step 208, as illustrated in FIG. 5A, illustrates first oxide layer 304. First oxide layer 304 may include an oxide, a nitride, or an oxynitride. For example, first oxide layer 304 may be a thermally grown silicon oxide, e.g., silicon dioxide, or a tetraethyl orthosilicate (TEOS) oxide. Alternatively, first oxide layer 304 may be silicon nitride. In various embodiments, first oxide layer 304 may be deposited or grown. In some embodiments, first oxide layer 304 may be deposited by applying a chemical vapor deposition (CVD) process, a physical vapor deposition (PVD) process, an atomic layer deposition (ALD) process, or a wet or dry oxidation of the substrate. In particular embodiments, first oxide layer 304 is formed as a TEOS oxide. According to particular embodiments, first oxide layer 304 is formed as a material that is electrically insulating, has strong adhesion properties with the material of substrate 302, includes low intrinsic stress, and has an available high selectivity etch process for the material of substrate 302 (in order to serve as an etch stop during etching of substrate 302).

According to various embodiments, following step 204 and before step 206, a reflective coating or layer may be deposited and patterned. For example, reflective coating 148 and reflective coating 152 as described hereinabove in reference to FIGS. 2A and 2B may be deposited and patterned after step 204. In such embodiments, any of the methods described in reference to step 204 may be used to deposit the reflective coating or layer. Further, the reflective coating or layer may be patterned using photolithographic processes or by using selective deposition techniques, such as described hereinafter in reference to step 208.

In various embodiments, step 206 includes depositing backplate layer 306. Intermediate structure 300a of step 208, as illustrated in FIG. 5A, illustrates backplate layer 306. Backplate layer 306 may include conductive or nonconductive material. In embodiments where backplate layer 306 is a conductive material, backplate layer 306 may be a doped or undoped semiconductor material. In particular embodiments, backplate layer 306 is polysilicon or monocrystalline silicon. Backplate layer 306 may be in situ doped or may undergo a dopant implantation process.

In further embodiments where backplate layer 306 is a conductive material, the conductive material may be a metallic material. Backplate layer 306 may include a pure metal, an alloy, or a compound. In some embodiments, backplate layer 306 includes one or more of the elements chosen from the group consisting of aluminum, copper, and nickel. In specific embodiments, backplate layer 306 includes pure aluminum, aluminum alloy, aluminum compound, pure copper, copper alloy, copper compound, pure nickel, nickel alloy and nickel compound. In one specific embodiment, backplate layer 306 is an aluminum alloy with silicon and copper. In other embodiments, the conductive material may include a conductive polymer.

In further embodiments, backplate layer 306 is a non-conductive material such as an oxide, nitride, or oxynitride. In still further embodiments, backplate layer 306 is a non-conductive polymer. Backplate layer 306 may be a layer stack including conductive and non-conductive materials. In one such embodiment, backplate layer 306 includes a stack of silicon nitride, polysilicon, and silicon nitride.

In various embodiments, backplate layer 306 may be deposited in different ways such as sputtering, PVD, CVD, or ALD. Backplate layer 306 may be deposited as a single step. When backplate layer 306 is a metallic material, it is possible that backplate layer 306 is deposited by a galvanic deposition. In various embodiments, backplate layer 306 may be deposited or grown using any of the techniques described hereinabove in reference to first oxide layer 304 in step 204. In particular embodiments, backplate layer 306 is deposited using CVD.

According to various embodiments, step 208 includes patterning backplate layer 306. Intermediate structure 300a of step 208, as illustrated in FIG. 5A, illustrates backplate layer 306 after patterning in step 208. In various embodiments, step 208 may include various patterning techniques such as photolithographic techniques or selective deposition. In some embodiments, step 208 includes depositing a photoresist, exposing the photoresist to a mask pattern, and developing the photoresist. Once the photoresist has been developed, step 208 includes etching backplate layer 306 based on the patterned photoresist.

Etching backplate layer 306 may include a wet chemistry etch or a dry chemistry etch. For example, when backplate layer 306 includes a semiconductor, e.g., polysilicon or a doped semiconductor such as doped polysilicon, backplate layer 306 may be etched with KOH or acid solutions of $HNO_3$ and HF. In another embodiment, a plasma process with chlorine or fluorine delivered by $SF_6$ or $Cl_2$ may be used to etch backplate layer 306. In alternative embodiments, etching backplate layer 306 may include a reactive ion etch (RIE) process. For an RIE process, an etch mask may be formed on the top surface of backplate layer 306 with the desired pattern. For example, the etch mask may be a photoresist material, an oxide layer, e.g., silicon dioxide, or a nitride layer patterned as the etch mask. Although backplate layer 306 is referred to as the backplate layer, backplate layer 306 may include portions that are disconnected from the backplate and will be connected to the membrane (from membrane layer 310), as will be described further hereinafter in reference to FIGS. 4, 5B, 5C, and 5D.

Figure 5B:
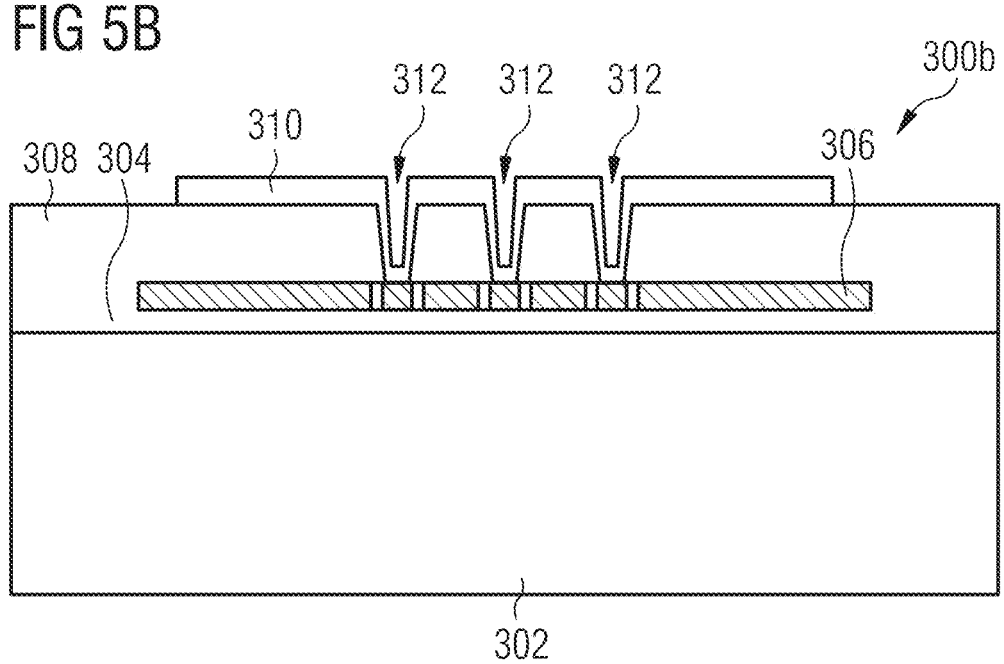

Following step 208, step 210 includes depositing second oxide layer 308. In various embodiments, step 210 may include any of the deposition techniques and materials described hereinabove in reference to depositing first oxide layer 304 in step 204. Intermediate structure 300b of step 216, as illustrated in FIG. 5B, illustrates second oxide layer 308. In particular embodiments, second oxide layer 308 is a TEOS oxide.

In various embodiments, step 212 includes patterning second oxide layer 308. In such embodiments, patterning second oxide layer 308 includes forming vias 312 in second oxide layer 308 over portions of backplate layer 306. Intermediate structure 300b of step 216, as illustrated in FIG. 5B, illustrates vias 312 formed in second oxide layer 308. In various embodiments, step 212 may include any of the etching and patterning techniques described hereinabove in reference to patterning backplate layer 306 in step 208.

According to various embodiments, step 214 includes depositing membrane layer 310. Intermediate structure 300b of step 216, as illustrated in FIG. 5B, illustrates membrane layer 310 deposited on second oxide layer 308. In various embodiments, step 214 may include any of the deposition techniques and materials described hereinabove in reference to depositing backplate layer 306 in step 206. In particular embodiments, membrane layer 310 is polysilicon. In alternative embodiments, step 214 may include depositing a first material, such as for filling vias 312, and a second different material as membrane layer 310.

In various embodiments, step 214 includes depositing a conformal layer on second oxide layer 308 and in vias 312. In particular embodiments, step 214 includes using CVD to deposit a conformal polysilicon layer. In alternative embodiments, step 214 includes depositing a non-conformal layer on second oxide layer 308 that fills vias 312.

According to various embodiments, step 216 includes patterning membrane layer 310. Intermediate structure 300b of step 216, as illustrated in FIG. 5B, illustrates membrane layer 310 after patterning in step 216. In various embodiments, membrane layer 310 is etched in order to be formed over backplate layer 306. Step 216 may also include forming openings in membrane layer 310 between vias 312 in order to form ventilation openings, such as ventilation openings 164 as described hereinabove in reference to FIG. 3B. In various embodiments, step 216 may include any etching and patterning techniques described hereinabove in reference to patterning backplate layer 306 in step 208.

Following step 216, additional steps (not shown) may be included for depositing and patterning a contact layer or contact layers. The contact layer is a conductive layer for forming contact lines and contact pads. In such embodiments, forming the contact layer may include depositing the contact layer by sputtering, PVD, CVD, ALD, or galvanic deposition. In various embodiments, the contact layer may include one or more of the elements from the group consisting of aluminum, nickel, copper, gold, platinum, and titanium. Further, the contact layer or layers may be patterned to form contact pads and contact lines. In other embodiments, contact pads may be formed using a silicide.

According to various embodiments, step 218 includes performing a backside etch of substrate 302 by etching from the back surface or backside of substrate 302. Intermediate structure 300c of step 218, as illustrated in FIG. 5C, illustrates cavity 314 in substrate 302 after etching in step 218. In such embodiments, substrate 302 is etched in step 218 with a directional etch. For example, substrate 302 is etched with a Bosch process etch. This backside etch is applied such that substrate 302 is removed under backplate layer 306 and membrane layer 310. In specific embodiments, the backside etch is stopped by first oxide layer 304.

In alternative embodiments, the backside of substrate 302 is etched with a wet etch using, for example, KOH. In another embodiment the backside of substrate 302 is etched with a combination of dry etch and subsequent wet etching with a higher selectivity of substrate 302, such as a higher silicon selectivity, for example, versus the etch rate of first oxide layer 304, for example.

Following step 218, step 220 includes performing a release etch by removing first oxide layer 304 beneath backplate layer 306 and second oxide layer 308 between backplate layer 306 and membrane layer 310. Intermediate structure 300d of step 220, as illustrated in FIG. 5D, illustrates membrane layer 310 and backplate layer 306 after etching in step 220. In such embodiments, first oxide layer 304 beneath backplate layer 306 and second oxide layer 308 between backplate layer 306 and membrane layer 310 are removed with a wet etch or a dry etch. For example, first oxide layer 304 and second oxide layer 308 are etched by applying an HF based solution or vapor. First oxide layer 304 and second oxide layer 308 may be removed using any of the etching techniques described hereinabove in reference to patterning backplate layer 306 in step 208.

In various embodiments, after completing step 220, membrane layer 310 is released and free to move. Further, reflective elements 316, which are portions of backplate layer 306, are attached to membrane layer 310 and move with membrane layer 310. In such embodiments, following the release etch of step 220, reflective elements 316 are arranged in the same plane as backplate layer 306 when membrane layer 310 is in the at rest position (un-deflected). In various embodiments, a reflective layer or coating may be applied to the bottom surface of backplate layer 306 and reflective elements 316. The reflective layer may include any of the materials described hereinabove in reference to reflective coating 148 and reflective coating 152 in FIGS. 2A and 2B. In different embodiments, the reflective layer may be formed between step 204 and step 206 (as described hereinabove) or after step 220.

Various additional steps or modifications may be included in method of fabrication 200, as will be readily appreciated by those of skill in the art. In different embodiments, depending on applications, various additional materials and fabrication techniques known to those of skill in the art may be applied to the various steps of method of fabrication 200. Such modifications are envisioned for various embodiments.

Figure 6A:
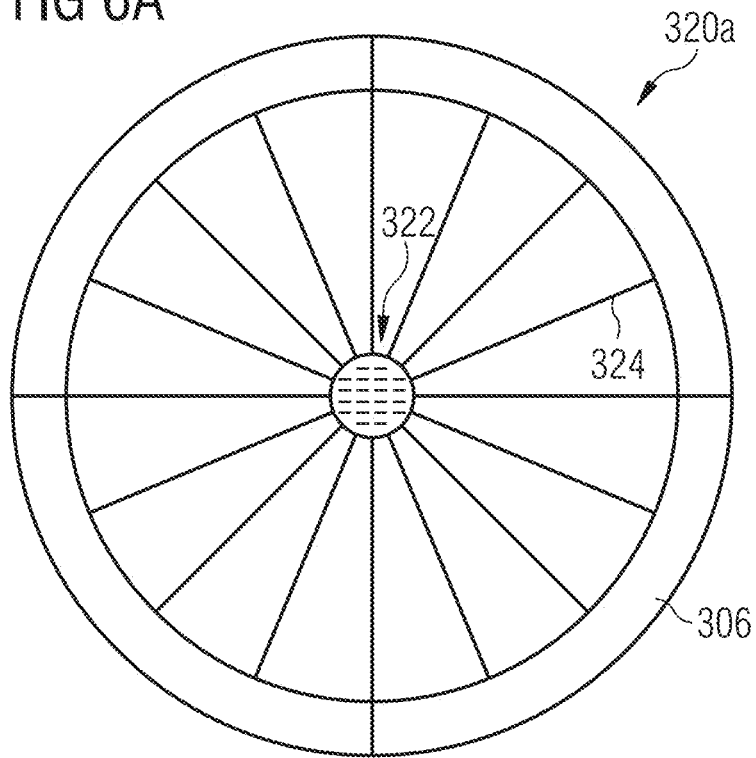
FIGS. 6A and 6B illustrate schematic top views of embodiment MEMS structures.
Figure 6B:
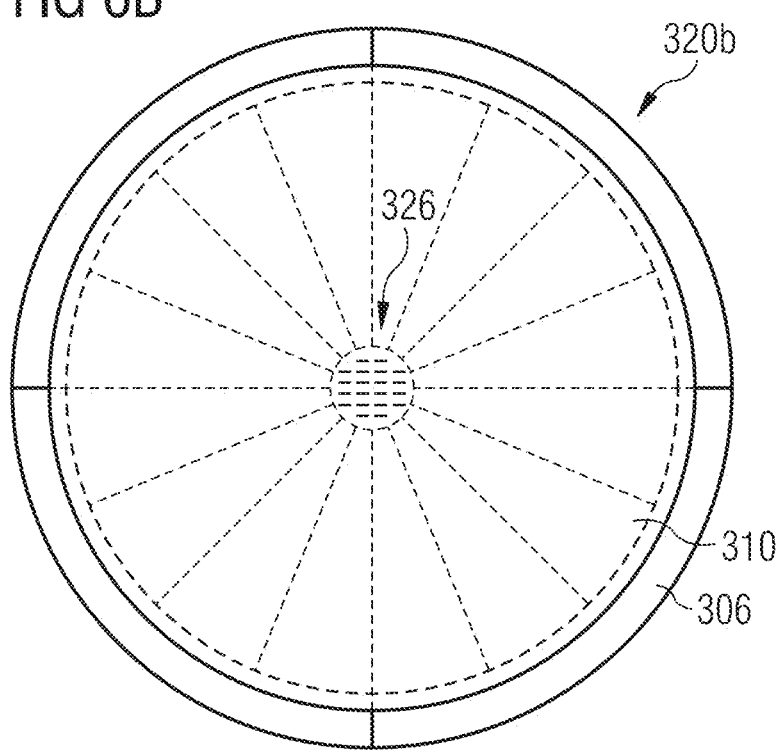

FIGS. 6A and 6B illustrate schematic top views of embodiment MEMS structures. Specifically, MEMS structure 320a illustrates backplate layer 306 after patterning in step 208 and MEMS structure 320b illustrates membrane layer 310 after patterning in step 216, as described hereinabove in reference to FIGS. 4, 5A, 5B, 5C, and 5D. In various embodiments, backplate layer 306 is patterned to include diffraction grating 322 supported by support beams 324, as similarly described hereinabove in reference to diffraction grating 124 and structural support 122 in FIGS. 2A and 2B. In other embodiments, backplate layer 306 may include diffraction grating 322 supported by a perforated support plate (not shown).

According to various embodiments, membrane layer 310 is formed over backplate layer 306 as described hereinabove in reference to FIGS. 4, 5A, 5B, 5C, and 5D. Further, membrane layer 310 may include extension region 326, which includes vias extending to slots in diffraction grating 322, as described hereinabove in reference to vias 312 and reflective elements 316 in FIGS. 4, 5A, 5B, 5C, and 5D, for example. As shown, extension region 326 is formed over diffraction grating 322.

According to an embodiment, an optical MEMS transducer includes a diffraction structure including alternating first reflective elements and openings arranged in a first plane, a reflection structure including second reflective elements and configured to deflect with respect to the diffraction structure, and an optical element configured to direct a first optical signal at the diffraction structure and the reflection structure and to receive a second optical signal from the diffraction structure and the reflection structure. The second reflective elements are arranged in the first plane when the reflection structure is at rest. Other embodiments include corresponding systems and apparatus, each configured to perform various embodiment methods.

In various embodiments, the diffraction structure further includes a ventilated support structure attached to an anchor, and a diffraction grating supported by the ventilated support structure. In such embodiments, the diffraction grating includes the first reflective elements and the openings. The reflection structure may further include a deflectable membrane layer offset from the diffraction structure, and a plurality of extension structures attached to the deflectable membrane layer, where each extension structure of the plurality of extension structures extends towards an opening of the diffraction structure, and each of the second reflective elements is attached to an extension structure of the plurality of extension structures inside an opening of the diffraction structure. In some embodiments, the deflectable membrane layer and the plurality of extension structures are formed of a same fabricated layer disposed in a single fabrication step. In further embodiments, the deflectable membrane layer further includes a plurality of openings, each opening of the plurality of openings arranged between two extension structures of the plurality of extension structures.

In various embodiments, the optical MEMS transducer further includes a laser configured to transmit a first optical signal at the diffraction structure, and a photodiode configured to receive a second optical signal from the diffraction structure and the reflection structure. In some embodiments, the optical MEMS transducer further includes a substrate including a cavity extending completely through the substrate from a top surface of the substrate to a bottom surface of the substrate, where the diffraction structure and the reflection structure are arranged on the top surface of the substrate above the cavity.

According to an embodiment, an optical MEMS transducer includes a rigid backplate including a diffraction grating arranged in a first plane, a deflectable membrane including a reflective surface, a light emitting element configured to transmit a first optical signal at the diffraction grating, and an optical detector configured to detect a second optical signal from the diffraction grating and the reflective surface. The reflective surface is arranged in the first plane. Other embodiments include corresponding systems and apparatus, each configured to perform various embodiment methods.

In various embodiments, the rigid backplate further includes a ventilated support structure extending from the diffraction grating to an anchor. In some embodiments, the ventilated support structure includes a perforated plate including a plurality of perforations. The ventilated support structure may include a plurality of support beams extending radially from the diffraction grating to the anchor in some embodiments.

In various embodiments, the deflectable membrane includes a deflectable membrane layer offset from the rigid backplate, a plurality of extension structures attached to the deflectable membrane layer, and a plurality of reflective elements together including the reflective surface. In such embodiments, each extension structure of the plurality of extension structures extends towards an opening in the diffraction grating and each reflective element of the plurality of reflective elements is attached to an extension structure of the plurality of extension structures inside an opening in the diffraction grating. In some embodiments, the plurality of reflective elements includes a first device layer attached to each extension structure of the plurality of extension structures, and the first device layer includes a same layer disposed in a same fabrication step as the rigid backplate.

According to an embodiment, an optical MEMS microphone includes a backplate and a membrane. The backplate includes a ventilated support structure attached to an anchor, and a diffraction grating supported by the ventilated support structure, where the diffraction grating includes a plurality of diffraction slots. The membrane includes a deflectable membrane layer offset from the backplate, a plurality of extension structures attached to the deflectable membrane layer, and a plurality of reflective elements. In such embodiments, each extension structure of the plurality of extension structures extends towards a diffraction slot of the plurality of diffraction slots, and each reflective element of the plurality of reflective elements is attached to an extension structure of the plurality of extension structures inside a diffraction slot of the plurality of diffraction slots. Other embodiments include corresponding systems and apparatus, each configured to perform various embodiment methods.

In various embodiments, the optical MEMS microphone further includes a laser configured to transmit a first optical signal at the diffraction grating, and a photodiode configured to receive a second optical signal from the diffraction grating and the reflective elements. In some embodiments, the ventilated support structure includes a plurality of support beams extending radially from the diffraction grating to the anchor. The deflectable membrane layer and the plurality of extension structures are formed of a same fabricated layer formed in a same deposition step in further embodiments.

In various embodiments, the plurality of reflective elements, the ventilated support structure, and the diffraction grating include a first fabricated layer formed in a same deposition step. In such embodiments, the plurality of reflective elements and the diffraction grating may further include a reflective coating on a bottom surface of the first fabricated layer.

According to an embodiment, a method of fabricating an optical MEMS transducer includes forming, on a substrate, a backplate including a diffraction grating, forming a plurality of reflective elements in openings in the diffraction grating, forming a structural material on the backplate, patterning the structural material to include a plurality of vias extending to the plurality of reflective elements, forming a membrane on the structural material, removing a backside portion of the substrate, and removing a portion of the structural material between the backplate and the membrane. The membrane is formed over the backplate and attached to the plurality of reflective elements, and the backside portion extends from a bottom surface of the substrate to a top surface of the substrate beneath the backplate. Other embodiments include corresponding systems and apparatus, each configured to perform various embodiment methods.

In various embodiments, forming the backplate includes depositing a backplate layer, and patterning the backplate layer to form a ventilated support structure and the diffraction grating. In some embodiments, forming the membrane includes depositing a membrane layer on the structural material and in the plurality of vias, and patterning the membrane layer. The method may further include forming a plurality of openings in the membrane, where each opening of the plurality of openings is between vias of the plurality of vias. In further embodiments, removing the backside portion of the substrate includes etchings using a Bosch process. In additional embodiments, the plurality of reflective elements and the backplate are formed of a first fabricated layer formed in a same deposition step.

Advantages of various embodiments described herein may include optical MEMS transducers having improved performance due to implementing structures that reduce or eliminate multiple reflections for the optical signal path from optical source to optical detector. Advantageously, some embodiments include optical MEMS transducers having a reflective surface of a rigid structure and a reflective surface of a deflectable structure formed in a same plane. In some embodiments, advantages include reduced fabrication processing efforts due to forming reflective surfaces of a backplate and membrane in the same plane, which requires only a single reflective layer or layer stack, as opposed to forming reflective surfaces of a backplate and membrane in different planes, which requires multiple reflective layers or layer stacks.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An optical microelectromechanical systems (MEMS) transducer comprising:
    a diffraction structure comprising alternating first reflective elements and openings arranged in a first plane; and
    a reflection structure comprising second reflective elements and configured to physically deflect with respect to the diffraction structure, wherein the second reflective elements are arranged in the first plane when the reflection structure is at rest.

2. The optical MEMS transducer of claim 1, wherein the diffraction structure further comprises:
    a ventilated support structure attached to an anchor; and
    a diffraction grating supported by the ventilated support structure, the diffraction grating comprising the first reflective elements and the openings.

3. The optical MEMS transducer of claim 1, wherein the reflection structure further comprises:
    a deflectable membrane layer offset from the diffraction structure; and
    a plurality of extension structures attached to the deflectable membrane layer, wherein
        each extension structure of the plurality of extension structures extends towards an opening of the diffraction structure, and
        each of the second reflective elements is attached to an extension structure of the plurality of extension structures inside an opening of the diffraction structure.

4. The optical MEMS transducer of claim 3, wherein the deflectable membrane layer and the plurality of extension structures are formed of a same fabricated layer disposed in a single fabrication step.

5. The optical MEMS transducer of claim 3, wherein the deflectable membrane layer further comprises a plurality of openings, each opening of the plurality of openings arranged between two extension structures of the plurality of extension structures.

6. The optical MEMS transducer of claim 1, further comprising:
    a laser configured to transmit a first optical signal at the diffraction structure; and
    a photodiode configured to receive a second optical signal from the diffraction structure and the reflection structure.

7. The optical MEMS transducer of claim 1, further comprising a substrate comprising a cavity extending completely through the substrate from a top surface of the substrate to a bottom surface of the substrate, wherein the diffraction structure and the reflection structure are arranged on the top surface of the substrate above the cavity.

8. An optical microelectromechanical systems (MEMS) transducer comprising:
    a rigid backplate comprising a diffraction grating arranged in a first plane; and
    a deflectable membrane comprising a reflective surface, the reflective surface being arranged in the first plane.

9. The optical MEMS transducer of claim 8, wherein the rigid backplate further comprises a ventilated support structure extending from the diffraction grating to an anchor.

10. The optical MEMS transducer of claim 9, wherein the ventilated support structure comprises a perforated plate comprising a plurality of perforations.

11. The optical MEMS transducer of claim 9, wherein the ventilated support structure comprises a plurality of support beams extending radially from the diffraction grating to the anchor.

12. The optical MEMS transducer of claim 8, wherein the deflectable membrane comprises:
    a deflectable membrane layer offset from the rigid backplate;
    a plurality of extension structures attached to the deflectable membrane layer, wherein each extension structure of the plurality of extension structures extends towards an opening in the diffraction grating; and
    a plurality of reflective elements together comprising the reflective surface, wherein each reflective element of the plurality of reflective elements is attached to an extension structure of the plurality of extension structures inside an opening in the diffraction grating.

13. The optical MEMS transducer of claim 12, wherein
    the plurality of reflective elements comprises a first device layer attached to each extension structure of the plurality of extension structures, and
    the first device layer comprises a same layer disposed in a same fabrication step as the rigid backplate.

14. A method of fabricating an optical microelectromechanical systems (MEMS) transducer, the method comprising:
    forming a rigid backplate comprising a diffraction grating arranged in a first plane; and
    forming a deflectable membrane comprising a reflective surface, the reflective surface being arranged in the first plane.

15. The method of claim 14, wherein:
    forming the rigid backplate comprises forming the rigid backplate on a substrate; and
    forming the deflectable membrane comprises
        forming a plurality of reflective elements in openings in the diffraction grating,
        forming a structural material on the rigid backplate,
        patterning the structural material to include a plurality of vias extending to the plurality of reflective elements, forming the deflectable membrane on the structural material, the deflectable membrane being formed over the rigid backplate and attached to the plurality of reflective elements, removing a backside portion of the substrate, the backside portion extending from a bottom surface of the substrate to a top surface of the substrate beneath the rigid backplate, and removing a portion of the structural material between the rigid backplate and the deflectable membrane.

16. The method of claim 15, wherein forming the rigid backplate comprises:

depositing a backplate layer; and patterning the backplate layer to form a ventilated support structure and the diffraction grating.

17. The method of claim 15, wherein forming the deflectable membrane comprises:

depositing a membrane layer on the structural material and in the plurality of vias; and patterning the membrane layer.

18. The method of claim 15, further comprising forming a plurality of openings in the deflectable membrane, each opening of the plurality of openings being between vias of the plurality of vias.

19. The method of claim 15, wherein removing the backside portion of the substrate comprises etchings using a Bosch process.

20. The method of claim 15, wherein the plurality of reflective elements and the rigid backplate are formed of a first fabricated layer formed in a same deposition step.

* * * * *